US012583958B2

(12) United States Patent
Zhang et al.

(10) Patent No.: US 12,583,958 B2
(45) Date of Patent: Mar. 24, 2026

(54) PHOTOPOLYMER FOR ANTI-YELLOWING AND ANTI-THERMAL CRACKING APPLICATIONS

(71) Applicant: Nano and Advanced Materials Institute Limited, Hong Kong (CN)

(72) Inventors: Liang Zhang, Hong Kong (CN); Kin Cheung Chan, Hong Kong (CN); Chun Kwong Yeung, Hong Kong (CN); Jifan Li, Hong Kong (CN)

(73) Assignee: Nano and Advanced Materials Institute Limited, Hong Kong (CN)

( * ) Notice: Subject to any disclaimer, the term of this patent is extended or adjusted under 35 U.S.C. 154(b) by 955 days.

(21) Appl. No.: 17/653,886

(22) Filed: Mar. 8, 2022

(65) Prior Publication Data

US 2022/0289884 A1 Sep. 15, 2022

Related U.S. Application Data

(60) Provisional application No. 63/200,526, filed on Mar. 12, 2021.

(51) Int. Cl.

| | |
|---|---|
| ***C08F 220/14*** | (2006.01) |
| ***C08F 220/18*** | (2006.01) |
| ***C09D 11/101*** | (2014.01) |
| ***C09D 11/102*** | (2014.01) |
| ***C09D 11/107*** | (2014.01) |
| ***C09D 11/36*** | (2014.01) |
| ***H05K 3/00*** | (2006.01) |

(52) U.S. Cl.

CPC ...... *C08F 220/14* (2013.01); *C08F 220/1804* (2020.02); *C08F 220/1806* (2020.02); *C09D 11/101* (2013.01); *C09D 11/102* (2013.01); *C09D 11/107* (2013.01); *C09D 11/36* (2013.01); *H05K 3/0076* (2013.01); *H05K 3/0082* (2013.01); *H05K 2203/0551* (2013.01)

(58) Field of Classification Search

CPC .. C08F 220/06; C08F 220/14; C08F 220/325; C08F 220/1802–1818; C08F 8/00; C09D 11/101; H05K 3/0076; H05K 3/0082; H05K 2203/0551

See application file for complete search history.

(56) References Cited

U.S. PATENT DOCUMENTS

| | | | | |
|---|---|---|---|---|
| 6,136,506 | A | 10/2000 | Hashimoto et al. | |
| 2006/0229376 | A1* | 10/2006 | Hayashi ................ | G03F 7/0007 522/6 |
| 2011/0086309 | A1* | 4/2011 | Nankawa .......... | C08F 220/1806 430/315 |

FOREIGN PATENT DOCUMENTS

| | | | |
|---|---|---|---|
| CN | 109415572 | A | 3/2019 |
| JP | H11288620 | A | 10/1999 |

OTHER PUBLICATIONS

Xiangfei Zheng et. al., "Synthesis of Methacrylic Copolymers Applied in Negative-Type Photoresist", Polymer Materials Science and Engineering, vol. 30, Issue 12, pp. 34-38.

First Office Action of CN2022101704389 issued from the China National Intellectual Property Administration on Mar. 25, 2023.

* cited by examiner

*Primary Examiner* — Satya B Sastri

(74) *Attorney, Agent, or Firm* — S&F/WEHRW

(57) ABSTRACT

An acrylate based photopolymer with high yellowing resistance, excellent photo sensitivity, high toughness, and high glass transition temperature, methods of preparation and used thereof, and solders comprising the same.

15 Claims, No Drawings

PHOTOPOLYMER FOR ANTI-YELLOWING AND ANTI-THERMAL CRACKING APPLICATIONS

CROSS-REFERENCE TO RELATED APPLICATIONS

This application claims the benefit of priority of U.S. Provisional Application No. 63/200,526, filed on Mar. 12, 2021, the contents of which are hereby incorporated by reference in their entirety for all purposes.

TECHNICAL FIELD

The present disclosure relates to photopolymers useful for solder mask ink with improved anti-yellowing and anti-thermal cracking properties.

BACKGROUND

A solder mask is a thin lacquer-like layer of polymer that is usually applied to the copper traces of a printed circuit board (PCB) for protection against oxidation and to prevent solder bridges from forming between closely spaced solder pads. Solder masks are photocured from solder mask ink, in which photopolymers play a key role in photocuring, adhesion, and the physical properties of the solder mask.

Typical solder mask inks are typically green. However, some solder mask inks are white, which are normally used in LED light or lamp applications. However, in automotive LED fabrication, white solder masks may crack easily when soldering and turn yellow under reflow soldering.

In order to overcome yellowing, some manufacturers tend to either add more titanium oxide to whiten the solder mask, or to add more blue dyes to neutralize the yellowing to maintain a white appearance over time. However, if too much titanium oxide is added, the viscosity of the ink will increase, leading to difficulties in solder mask ink processing. Increases in titanium oxide may also decrease toughness and adherence of the solder mask, which can result in cracking and peeling off of the solder mask. If more blue dye is added to the solder mask ink, the sold mask will appear bluish-white in beginning, which can be aesthetically unpleasing.

For thermal cracking, glass transition temperature and toughness of the solder mask are of great importance. High crosslink density in the solder mask can improve the Tg, which can reduce deformation at high temperature. However, the solder mask may become more fragile when under fast cooling. Flexible functional groups, therefore, need to be introduced to enhance the toughness to protect against large and fast temperature change.

There is thus a need for improved solder mask inks that address or overcome at least some of the aforementioned problems.

SUMMARY

The present disclosure provides an acrylate based photopolymer structure with high yellowing resistance, excellent photo sensitivity, high toughness, and high glass transition temperature. Such compound could be used in white solder mask ink for automotive LED application.

In a first aspect, provided herein is a photopolymer comprising: a monomer of Formula I, a monomer of Formula II, a monomer of Formula III, and a monomer of Formula IV:

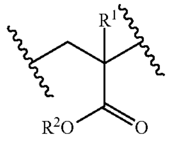
I

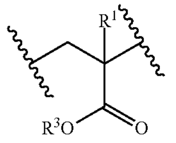
II

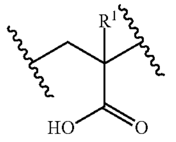
III

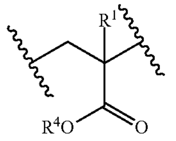
IV wherein each $R^1$ for each occurrence is independently hydrogen or methyl;

$R^2$ is cycloalkyl or heterocycloalkyl;

$R^3$ is alkyl; and $R^4$ is a moiety represented by the Formula V:

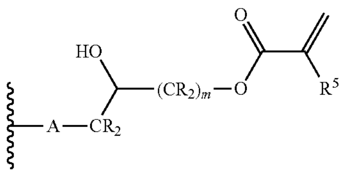
V wherein A is —$(CR_2)_nO$— or a bond;

m is a whole number selected from 1-10;

n is a whole number selected from 1-10;

R for each occurrence is independently hydrogen or alkyl; or two R taken together with the carbon atoms to which they are attached form a 3-8 membered cycloalkyl; and $R^5$ is hydrogen or methyl.

In certain embodiments, $R^2$ is $C_3$-$C_{12}$ cycloalkyl or $C_6$-$C_{12}$ polycyclyl.

In certain embodiments, $R^2$ is isobornyl, cyclohexyl, cyclopentyl, 3,3,5-trimethylcyclohexyl, tetrahydrofurfuryl, or 2-tetrahydropyranyl.

In certain embodiments, $R^3$ is $C_1$-$C_{12}$ alkyl.

In certain embodiments, $R^3$ is methyl, ethyl, propyl, isopropyl, butyl, isobutyl, tert-butyl, hexyl, octyl, decyl, or 2-ethylhexyl.

In certain embodiments, $R^4$ is selected from the group consisting of:

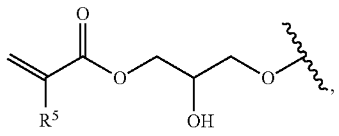

-continued

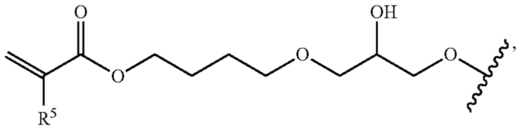

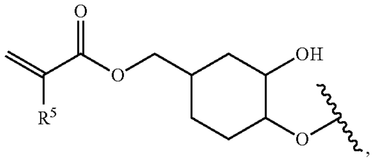

, and

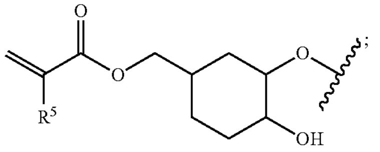

or $R^4$ is a mixture of

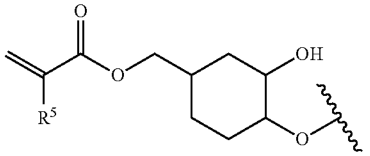

and

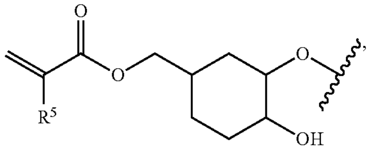

wherein $R^5$ is hydrogen or methyl.

In certain embodiments, $R^2$ is $C_3$-$C_{12}$ cycloalkyl or $C_6$-$C_{12}$ polycyclyl; $R^3$ is $C_1$-$C_{12}$ alkyl; and $R^4$ is selected from the group consisting of:

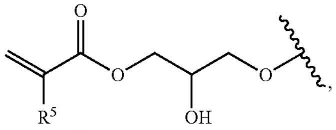

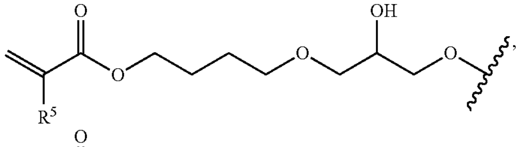

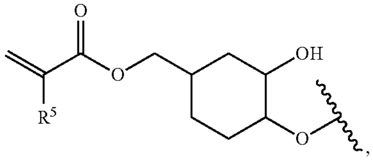

, and

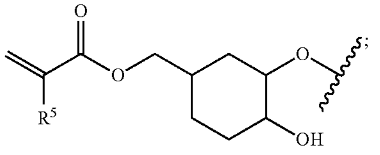

or $R^4$ is a mixture of

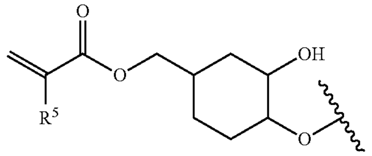

and

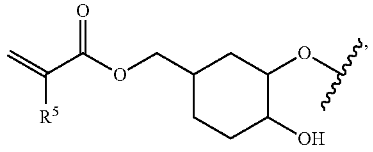

wherein $R^5$ is hydrogen or methyl.

In certain embodiments, $R^1$ is methyl; $R^2$ is isobornyl or cyclohexyl; $R^3$ is methyl, isobutyl, or n-hexyl; and $R^4$ is:

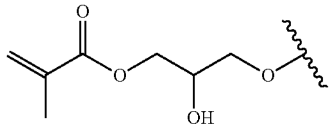 [SMILES: *OCC(O)COC(=O)C(=C)C]

or a mixture of

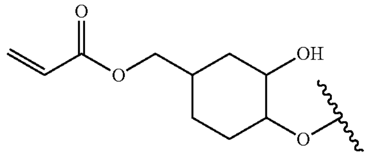

and

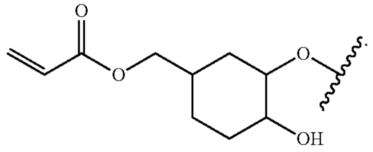

In certain embodiments, the monomer of Formula I is present in the photopolymer between 1-15 mol % or 1-10 mol % relative to the total moles of the monomer of Formula I, the monomer of Formula II, the monomer of Formula III, and the monomer of Formula IV.

In certain embodiments, the monomer of Formula II is present in the photopolymer between 20-55 mol % or 35-50 mol % relative to the total moles of the monomer of Formula I, the monomer of Formula II, the monomer of Formula III, and the monomer of Formula IV.

In certain embodiments, the Formula III is present in the photopolymer between 10-30 mol % or 15-25 mol % relative to the total moles of the monomer of Formula I, the monomer of Formula II, the monomer of Formula III, and the monomer of Formula IV.

In certain embodiments, the Formula IV is present in the photopolymer between 30-55 mol % or 35-48 mol % relative to the total moles of the monomer of Formula I, the monomer of Formula II, the monomer of Formula III, and the monomer of Formula IV.

In certain embodiments, the monomer of Formula I, the monomer of Formula II, the monomer of Formula III, and the monomer of Formula IV are present in the photopolymer between 1-10 mol %, 35-50 mol %, 15-25 mol %, and 35-48 mol %, respectively, relative to the total moles of the monomer of Formula I, the monomer of Formula II, the monomer of Formula III, and the monomer of Formula IV.

In certain embodiments, the monomer of Formula I, the monomer of Formula II, the monomer of Formula III, and the monomer of Formula IV are present in the photopolymer between 1-10 mol %, 35-50 mol %, 15-25 mol %, and 35-48 mol %, respectively, relative to the total moles of the monomer of Formula I, the monomer of Formula II, the monomer of Formula III, and the monomer of Formula IV.

In certain embodiments, the photopolymer has an average molecular weight between 5,000 to 80,000 amu or 10,000 to 40,000 amu.

In certain embodiments, the photopolymer is selected from the group consisting of: a photopolymer, wherein $R^1$ is methyl; $R^2$ is cyclohexyl; $R^3$ is isobutyl; and $R^4$ is a mixture of

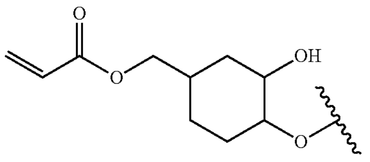

and

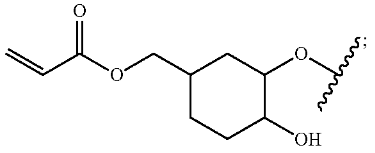

a photopolymer, wherein $R^1$ is methyl; $R^2$ is isobornyl; $R^3$ is n-hexyl; and $R^4$ is a mixture of

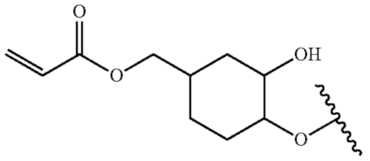

and

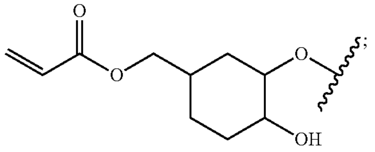

or a photopolymer, wherein $R^1$ is methyl; $R^2$ is cyclohexyl; $R^3$ is methyl; and $R^4$ is

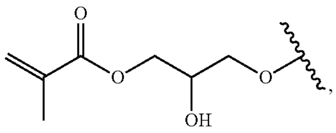 [SMILES: *OCC(O)COC(=O)C(=C)C]

wherein the monomer of Formula I, the monomer of Formula II, the monomer of Formula III, and the monomer of Formula IV are present in the photopolymer between 1-10 mol %, 35-50 mol %, 15-25 mol %, and 35-48 mol %, respectively, relative to the total moles of the monomer of Formula I, the monomer of Formula II, the monomer of Formula III, and the monomer of Formula IV.

In certain embodiments, the photopolymer has an average molecular weight between 18,000 to 23,000 amu.

In a second aspect, provided herein is a solder mask ink comprising the photopolymer described herein and an epoxy resin.

In certain embodiments, the solder mask ink further comprises a photoinitiator, a crosslinker, and a metal oxide.

In a third aspect, provided herein is a method of applying the solder mask ink described herein to a substrate, the method comprising: applying the solder mask ink to a surface of the substrate and irradiating the solder mask ink with ultraviolet radiation.

DETAILED DESCRIPTION

Definitions

Throughout the application, where compositions are described as having, including, or comprising specific components, or where processes are described as having, including, or comprising specific process steps, it is contemplated that compositions of the present teachings can also consist essentially of, or consist of, the recited components, and that the processes of the present teachings can also consist essentially of, or consist of, the recited process steps.

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a composition or a method described herein can be combined in a variety of ways without departing from the spirit and scope of the present teachings, whether explicit or implicit herein.

It should be understood that the order of steps or order for performing certain actions is immaterial so long as the present teachings remain operable. Moreover, two or more steps or actions may be conducted simultaneously.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10%, ±7%, ±5%, ±3%, ±1%, or ±0% variation from the nominal value unless otherwise indicated or inferred.

The term "composition" is intended to encompass a product comprising the specified ingredients in the specified amounts, as well as any product that results, directly or indirectly, from combinations of the specified ingredients in the specified amounts.

As used herein, "alkyl" refers to a straight-chain or branched saturated hydrocarbon group. Examples of alkyl groups include methyl, ethyl, propyl (e.g., n-propyl and isopropyl), butyl (e.g., n-butyl, iso-butyl, sec-butyl, tert-butyl), pentyl groups (e.g., 1-methylbutyl, 2-methylbutyl, iso-pentyl, tert-pentyl, 1,2-dimethylpropyl, neopentyl, and 1-ethylpropyl), hexyl groups, and the like. In various embodiments, an alkyl group can have 1 to 40 carbon atoms (i.e., $C_1$-$C_{40}$ alkyl group), for example, 1-30 carbon atoms (i.e., $C_1$-$C_{30}$ alkyl group). In certain embodiments, an alkyl group can have 1 to 6 carbon atoms, and can be referred to as a "lower alkyl group." Examples of lower alkyl groups include methyl, ethyl, propyl (e.g., n-propyl and isopropyl), and butyl groups (e.g., n-butyl, isobutyl, sec-butyl, tert-butyl). In certain embodiments, alkyl groups can be optionally substituted as described herein. An alkyl group is generally not substituted with another alkyl group, an alkenyl group, or an alkynyl group.

As used herein, "cycloalkyl" by itself or as part of another substituent means, unless otherwise stated, a monocyclic hydrocarbon having between 3-12 carbon atoms in the ring system and includes hydrogen, straight chain, branched chain, and/or cyclic substituents. Exemplary cycloalkyls include cyclopropyl, cyclobutyl, cyclopentyl, cyclohexyl, cycloheptyl, and the like.

The terms "polycyclyl" or "polycyclic group" are art-recognized and refer to two or more rings (e.g., cycloalkyls, cycloalkenyls, cycloalkynyls, aryls and/or heterocyclyls) in which two or more carbons are common to two adjoining rings, e.g., the rings are "fused rings". Rings that are joined through non-adjacent atoms are termed "bridged" rings. Each of the rings of the polycycle may be substituted with such substituents as described herein, as for example, halogen, alkyl, aralkyl, alkenyl, alkynyl, cycloalkyl, hydroxyl, amino, nitro, sulfhydryl, imino, amido, phosphonate, phosphinate, carbonyl, carboxyl, silyl, ether, alkylthio, sulfonyl, ketone, aldehyde, ester, a heterocyclyl, an aromatic or heteroaromatic moiety, —$CF_3$, —CN, or the like.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly p-conjugated and optionally substituted as described herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide thiophene S-oxide, thiophene S,S-dioxide). Examples of heteroaryl groups include, for example, the 5- or 6-membered monocyclic and 5-6 membered bicyclic ring systems shown below: where T is O, S, NH, N-alkyl, N-aryl, N-(arylalkyl) (e.g., N-benzyl), $SiH_2$, SiH(alkyl), $Si(alkyl)_2$, SiH(arylalkyl), $Si(arylalkyl)_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be optionally substituted as described herein. The heterocyclic ring may be substituted at one or more positions with such substituents as described herein, as for example, halogen, alkyl, aralkyl, alkenyl, alkynyl, cycloalkyl, hydroxyl, amino, nitro, sulfhydryl, imino, amido, phosphonate, phosphinate, carbonyl, carboxyl, silyl, ether, alkylthio, sulfonyl, ketone, aldehyde, ester, a heterocyclyl, an aromatic or heteroaromatic moiety, —$CF_3$, —CN, or the like.

The term "optionally substituted" refers to a chemical group, such as alkyl, cycloalkyl, aryl, heteroaryl, and the like, wherein one or more hydrogen may be replaced with a substituent as described herein, for example, halogen, azide, alkyl, aralkyl, alkenyl, alkynyl, cycloalkyl, hydroxyl, alkoxyl, amino, nitro, sulfhydryl, imino, amido, phosphonate, phosphinate, carbonyl, carboxyl, silyl, ether, alkylthio, sulfonyl, sulfonamido, ketone, aldehyde, ester, heterocyclyl, aromatic or heteroaromatic moieties, —$CF_3$, —CN, or the like.

As used herein, a "polymeric compound" (or "polymer") refers to a molecule including a plurality of one or more repeating units connected by covalent chemical bonds. A polymeric compound can be represented by General Formula I:

$$*\text{-}(\text{-}(Ma)_x\text{-}(Mb)_y\text{-})_z\text{*} \quad \text{General Formula I}$$

wherein each Ma and Mb is a repeating unit or monomer. The polymeric compound can have only one type of repeating unit as well as two or more types of different repeating units. When a polymeric compound has only one type of repeating unit, it can be referred to as a homopolymer. When a polymeric compound has two or more types of different repeating units, the term "copolymer" or "copolymeric compound" can be used instead. For example, a copolymeric compound can include repeating units where Ma and Mb represent two different repeating units. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer. For example, General Formula I can be used to represent a copolymer of Ma and Mb having x mole fraction of Ma and y mole fraction of Mb in the copolymer, where the manner in which comonomers Ma and Mb is repeated can be alternating, random, regiorandom, regioregular, or in blocks, with up to z comonomers present. In addition to its composition, a polymeric compound can be further characterized by its degree of polymerization (n) and molar mass (e.g., number average molecular weight (M) and/or weight average molecular weight (Mw) depending on the measuring technique(s)).

The representation "⌇" as used herein in connection to chemical a group or moiety is intended to represent the covalent bond that the aforementioned chemical group or moiety is covalently bonded to another chemical group or moiety.

The present disclosure provides a photopolymer comprising: a monomer of Formula I, a monomer of Formula II, a monomer of Formula III, and a monomer of Formula IV:

I

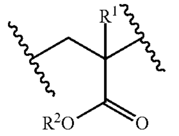

II

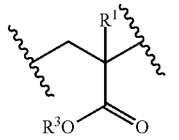

III

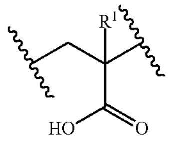

IV

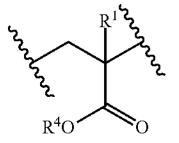

wherein each $R^1$ for each occurrence is independently hydrogen or methyl;

$R^2$ is cycloalkyl or heterocycloalkyl;

$R^3$ is alkyl; and $R^4$ is a moiety represented by the Formula V:

V

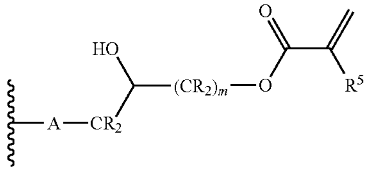

wherein A is —$(CR_2)_nO$— or a bond;

m is a whole number selected from 1-10;

n is a whole number selected from 1-10;

R for each occurrence is independently hydrogen or alkyl; or two R taken together with the carbon atoms to which they are attached form a 3-8 membered cycloalkyl; and $R^5$ is hydrogen or methyl.

The photopolymer can be a random copolymer, an alternating copolymer, or a block copolymer. In certain embodiments, the photopolymer is a random copolymer.

In certain embodiments, $R^2$ is a $C_3$-$C_{12}$ cycloalkyl, $C_3$-$C_{10}$ cycloalkyl, $C_3$-$C_8$ cycloalkyl, $C_3$-$C_7$ cycloalkyl, $C_3$-$C_6$ cycloalkyl, $C_3$-$C_5$ cycloalkyl, $C_2$-$C_{12}$ heterocycloalkyl, $C_2$-$C_{10}$ heterocycloalkyl, $C_2$-$C_8$ heterocycloalkyl, $C_2$-$C_6$ heterocycloalkyl, $C_3$-$C_6$ heterocycloalkyl, $C_3$-$C_5$ heterocycloalkyl, or $C_3$-$C_4$ heterocycloalkyl, wherein the heterocycloalkyl comprises up to three heteroatoms selected from O, S, and N. In certain embodiments, $R^2$ is isobornyl, cyclohexyl, cyclopentyl, 3,3,5-trimethylcyclohexyl, tetrahydrofurfuryl, or 2-tetrahydropyranyl. In certain embodiments, $R^2$ is isobornyl or cyclohexyl.

In certain embodiments, $R^3$ is $C_1$-$C_{12}$ alkyl, $C_1$-$C_{10}$ alkyl, $C_1$-$C_8$ alkyl, $C_1$-$C_6$ alkyl, $C_1$-$C_4$ alkyl, $C_4$-$C_6$ alkyl, $C_1$-$C_4$ alkyl, or $C_1$-$C_2$ alkyl, wherein the alkyl is linear or branched.

In certain embodiments, $R^3$ is methyl, ethyl, propyl, isopropyl, butyl, isobutyl, tert-butyl, hexyl, octyl, decyl, or 2-ethylhexyl. In certain embodiments, $R^3$ is methyl, isobutyl, or n-hexyl.

In certain embodiments, m is a whole number selected from 1-8, 1-7, 1-6, 1-5, 1-4, 1-3, or 1-2.

In certain embodiments, n is a whole number selected from 2-8, 2-7, 2-6, 2-5, 3-5, 2-4, or 2-3.

In certain embodiments, R for each occurrence is independently hydrogen, $C_1$-$C_6$ alkyl, $C_1$-$C_5$ alkyl, $C_1$-$C_4$ alkyl, $C_1$-$C_3$ alkyl, or $C_1$-$C_2$ alkyl; or two R taken together with the carbon atoms to which they are attached form a 3-8, 3-7, 3-6, 5-6, 3-5, or 3-4 membered cycloalkyl.

In certain embodiments, $R^4$ is a moiety represented by the Formula VI:

VI

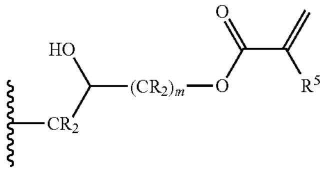

wherein m is a whole number selected from 1-10;

R for each occurrence is independently hydrogen or alkyl; or two R taken together with the carbon atoms to which they are attached form a 3-8 membered cycloalkyl; and $R^5$ is hydrogen or methyl.

In certain embodiments, $R^4$ is a moiety represented by the Formula VII:

VII

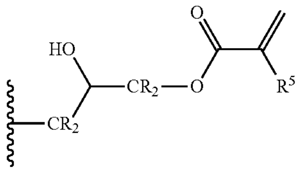

wherein R for each occurrence is independently hydrogen or alkyl; and $R^5$ is hydrogen or methyl.

In certain embodiments, $R^4$ is a moiety represented by the Formula VIII:

VIII

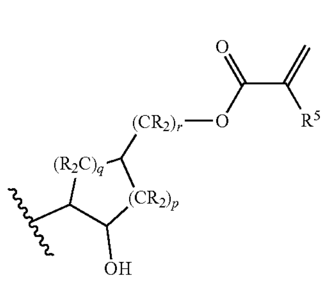

wherein p is a whole number selected from 0-3;
wherein q is a whole number selected from 0-3;
wherein r is a whole number selected from 0-3;
R for each occurrence is independently hydrogen or alkyl; and
$R^5$ is hydrogen or methyl.

In certain embodiments, p is 1; q is 2; and r is 1.

In certain embodiments, $R^4$ is selected from the group consisting of:

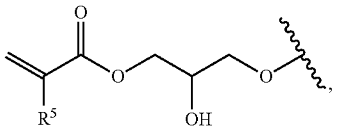
,
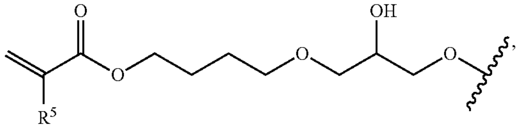
,
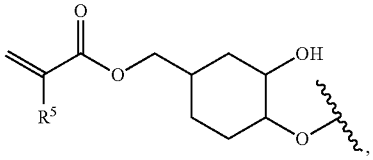
, and
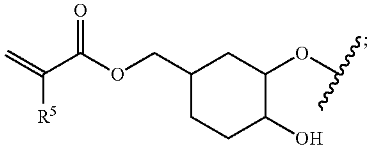
;

or $R^4$ is a mixture of

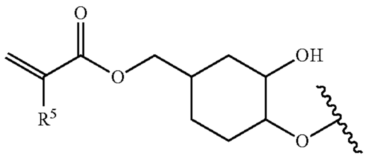
and
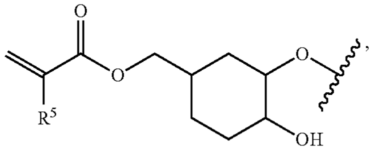
, wherein $R^5$ is hydrogen or methyl.

In certain embodiments, the monomer of Formula I is present in the photopolymer between 1-15 mol %, 1-14 mol %, 1-13 mol %, 1-12 mol %, 1-11 mol %, 1-10 mol %, or 5-10 mol % relative to the total moles of the monomer of Formula I, the monomer of Formula II, the monomer of Formula III, and the monomer of Formula IV.

In certain embodiments, the monomer of Formula II is present in the photopolymer between 20-55 mol %, 25-55 mol %, 30-55 mol %, 30-50 mol %, or 35-50 mol % relative to the total moles of the monomer of Formula I, the monomer of Formula II, the monomer of Formula III, and the monomer of Formula IV.

In certain embodiments, the Formula III is present in the photopolymer between 10-30 mol % or 15-25 mol % relative to the total moles of the monomer of Formula I, the monomer of Formula II, the monomer of Formula III, and the monomer of Formula IV.

In certain embodiments, the Formula IV is present in the photopolymer between 30-55 mol %, 30-50 mol %, 30-45 mol %, 35-45 mol %, or 35-48 mol % relative to the total moles of the monomer of Formula I, the monomer of Formula II, the monomer of Formula III, and the monomer of Formula IV.

In certain embodiments, the photopolymer has an average molecular weight between 5,000 to 80,000 amu, 5,000 to 70,000 amu, 5,000 to 60,000 amu, 5,000 to 50,000 amu, 10,000 to 40,000 amu, 10,000 to 30,000 amu, 15,000 to 30,000 amu, 15,000 to 30,000 amu, 15,000 to 25,000 amu, or 18,000 to 23,000 amu.

The present disclosure also provides a solder mask ink comprising at least one photopolymer described herein and an epoxy resin.

The epoxy resin can be any conventional epoxy resin. Exemplary epoxy resins include, but are not limited to, cresol novolac epoxy resins, phenol novolac epoxy resins, bisphenol A epoxy resins, bisphenol F epoxy resins, bisphenol A-novolac epoxy resins, naphthalene epoxy resins, biphenyl epoxy resins, biphenyl aralkyl epoxy resins, polyacrylate epoxy resin, and combinations thereof.

In certain embodiments, the solder mask ink further comprises at least one additive selected from the group consisting of a photoinitiator, a crosslinker, a metal oxide, and a leveling agent.

The photoinitiator should be suitable to cause polymerization (i.e., curing) of the solder mask ink after its application to a substrate. For most acrylate-based coating formulations, photoinitiators, such as the ketonic photoinitiating and/or phosphine oxide additives, can be used. When used in the solder mask ink described herein, the photoinitiator is present in an amount sufficient to provide rapid ultraviolet curing.

Suitable photoinitiators include, but are not limited to, 1-hydroxycyclohexylphenyl ketone (e.g., Irgacure 184 available from Ciba Specialty Chemical (Hawthorne, N.Y.)), bis (2,6-dimethoxybenzoyl)-2,4,4-trimethylpentyl phosphine oxide (e.g., commercial blends Irgacure 1800, 1850, and 1700 available from Ciba Specialty Chemical), 2,2-dimethoxyl-2-phenyl acetophenone (e.g., Irgacure 651, available from Ciba Specialty Chemical), bis(2,4,6-trimethyl benzoyl)phenyl-phosphine oxide (Irgacure 819), (2,4,6-trimethylbenzoyl)diphenyl phosphine oxide (Lucerin TPO, available from BASF (Munich, Germany)), ethoxy (2,4,6-trimethylbenzoyl)phenyl phosphine oxide (Lucerin TPO-L from BASF), and combinations thereof. In certain embodiments, the photoinitiator is TPO.

The crosslinker can be a diacrylate of a glycol, such as ethylene glycol, polyethylene glycol, and propylene glycol; polyacrylates of polyvalent alcohols, such as hexanediol, trimethylolpropane, pentaerythritol, dipentaerythritol, or tris-hydroxyethyl isocyanurate; a polyglycidyl ether, such as trimethylolpropane triglycidyl ether, and triglycidyl isocyanurate, tris(4-hydroxyphenyl)methane triglycidyl ether, glyceryl propoxy triacrylate, glyceryl trimethacrylate, other triacrylates of glycol, and 1,1,1,tris (4-hydroxyphenyl) ethane; or combinations thereof. In certain embodiments, the crosslinker is triglycidyl isocyanurate and dipentaerythritol penta-/hexa-acrylate.

The metal oxide can be titanium dioxide, copper oxide, zirconium oxide, or combinations thereof. In certain embodiments, the metal is titanium dioxide.

The leveling agent can be polyacrylate-based agent sold under the trade name BYK®-354 by BYK®.

The photopolymer described herein can be present in the solder mask ink at 10-60% wt/wt, 10-50% wt/wt, 10-40% wt/wt, 10-30% wt/wt, 20-30% wt/wt, or 25-30% wt/wt.

The epoxy resin can be present in the solder mask ink at 10-50% wt/wt, 10-40% wt/wt, 10-30% wt/wt, 20-30% wt/wt, or 25-30% wt/wt.

The metal oxide can be present in the solder mask ink at 10-50% wt/wt, 10-40% wt/wt, 10-30% wt/wt, 20-30% wt/wt, or 25-30% wt/wt.

The crosslinker can be present in the solder mask ink at 1-20% wt/wt, 1-10% wt/wt, or 5-10% wt/wt.

The photoinitiator can be present in the solder mask ink at 1-10% wt/wt, 1-5% wt/wt, or 3-5% wt/wt.

The solder mask ink may further comprise a solvent, such as an alcohol or an ether, such as di(propylene glycol) methyl ether.

The present disclosure also provides a method of applying the solder mask ink described herein to a substrate, the method comprising: applying the solder mask ink to a surface of the substrate and irradiating the solder mask ink with ultraviolet radiation.

The substrate can be any material including, but not limited to, glass, metal, such as gold, silver, palladium, nickel/gold, nickel, tin, tin/lead, aluminum, tin/aluminum and copper, an organic resin, a paper/resin composite or a resin/fiber glass composite, ceramic, a polyester, or a polyimide.

In certain embodiments, the method further comprises curing the solder mask ink prior to the step of irradiating the solder mask ink with ultraviolet radiation.

The solder mask ink can be cured at a temperature between 50-100° C., 50-90° C., 50-80° C., 60-80° C., or 70-80° C.

EXAMPLES

Example 1—Synthesis of Compound 1

Compound 1

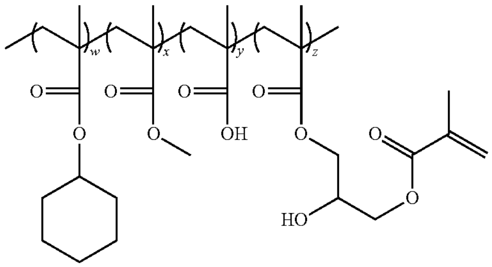

In the first step, di(propylene glycol) methyl ether was added to reactor and degassed by nitrogen. Azobisisobutyronitrile (21.4 g, 0.13 mol), cyclohexyl methacrylate (98 g, 0.58 mol), methyl methacrylate (216 g, 2.16 mol) and methacrylic acid (295 g, 3.43 mol) were then added slowly. The reaction was stirred at 95 degree C. for 8 hours, and then stirred at 120 degree C. for another 1 hour.

In the second step, after cooling down to 90 degree C., triphenylphosphine (9.0 g, 0.034 mol), 4-methoxyphenol (2.1 g, 0.017 mol) were added, followed by slow addition of glycidyl methacrylate (301 g, 2.12 mol). The reaction was stirred at 90 degree C. for another 27 hours to yield the desired product.

For Compound 1, w, x, y, and z represent the mol % of each monomer. For the present example, the mol % is w=9.4%, x=35.1%, y=21.2%, and z=34.3%.

Example 2—Synthesis of Compound 2

Compound 2

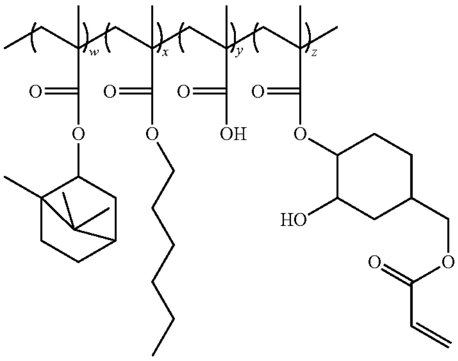

Compound 2 was synthesized using an analagous approach as Compound 1.

For Compound 2, w, x, y, and z represent the mol % of each monomer. For the present example, the mol % is w=9.4%, x=35.1%, y=21.2%, and z=34.3%.

Example 3—Synthesis of Compound 3

Compound 3

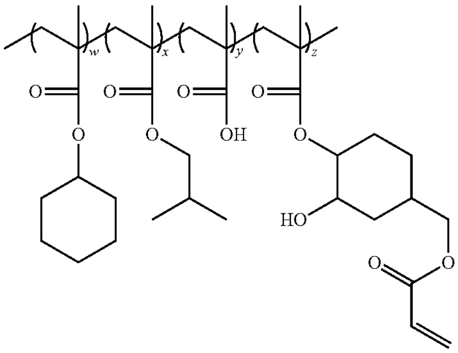

Compound 3 was synthesized using an analagous approach as Compound 1.

For Compound 3, w, x, y, and z represent the mol % of each monomer. For the present example, the mol % is w=9.4%, x=35.1%, y=21.2%, and z=34.3%.

Example 4—Preparation of Solder Mask Ink

Part A:

| | Phr |
|---|---|
| Compound 2 | 35 |
| Polyacrylate-based epoxy resin (CCR-4959HW) | 25 |

-continued

| | Phr |
|---|---|
| $TiO_2$ (TR81) | 34 |
| Polyacrylate-based surface additive (BYK ®-354) | 0.5 |
| TPO | 5.5 |

Part B:

| | Phr |
|---|---|
| Novolac Type Epoxy Resin (NPCN-704) | 35 |
| Dipentaerythritol penta-/hexa-acrylate (DPHA) | 23 |
| Triglycidyl isocyanurate (TGIC) | 12 |
| $TiO_2$ (TR81) | 30 |

The materials in Part A and Part B are premixed in di(propylene glycol) methyl ether. Part A and Part B are mixed in a weight ratio of 3:1 to form the solder mask.

The solder mask ink with thickness around 25 μm was screen printed on PCB FR4 with 1 oz copper. After printing, the board was pre-baked at 75 degree C. for 45 min, and then exposed under UV light with intensity 600 mJ/cm2 for 20 seconds, followed by developing via 1% sodium carbonate solution. Then the board was post-cured at 150 degree C. for one more hour before testing.

Example 5—Solder Mask Ink Testing

Compounds 1, 2, and 3 was used in 50% solid content in di(propylene glycol) methyl ether, mixed with epoxy resin, photoinitiator, crosslinker, metal oxide to yield a white solder mask ink. The performance of photopolymer and ink such as glass transition temperature, ink developing, pencil hardness, anti-yellowing, anti-thermal cracking and gloss are shown in Table 1.

TABLE 1

| | Compound 1 | Compound 2 | Compound 3 |
|---|---|---|---|
| Glass transition temperature | 132° C. | 130° C. | 128° C. |
| Pre-bake temperature | 73° C. × 45 min | 73° C. × 45 min | 73° C. × 45 min |
| Developing | Good | Good | Good |
| Pencil hardness | 6H | 6H | 6H |
| Anti-yellowing | Pass | Pass | Pass |
| Anti-thermal cracking | Pass | Pass | Pass |
| Gloss (60°) | 65 | 66 | 69 |

Developing is carried out by using 1% sodium carbonate solution; Anti-yellowing test is carried out at 270° C. for 5 min, and repeated for 3 times; Anti-thermal cracking is carried out at 288° C. in solder pot for 10 s, and repeated for 3 times.

Example 6—Solder Mask Ink Testing

The effect varying the mol % of each monomer and the average molecular weight on the physical-chemical properties of the Compound 1 were evaluated. The results of these tests are presented in Table 2.

TABLE 2

| | Compound 1 | | | | | |
|---|---|---|---|---|---|---|
| | MW = 18000~23000 | | | | MW = 7000~9000 | |
| Mol % monomer of each | I = 9.4%<br>II = 35.1%<br>III = 21.2%<br>IV = 34.3% | I = 9.4%<br>II = 35.1%<br>III = 21.2%<br>IV = 44.3% | I = 24.4%<br>II = 20.1%<br>III = 21.2%<br>IV = 34.3% | I = 9.4%<br>II = 35.1%<br>III = 11.2%<br>IV= 25.5% | I = 24.4%<br>II = 10.1%<br>III = 30%<br>IV = 44.3% | I = 9.4%<br>II = 35.0%<br>III = 21.2%<br>IV = 34.3% |
| Glass transition temperature | 132° C. | 138° C. | 130° C. | 118° C. | 142° C. | 110° C. |
| Developing | Good | Poor | Good | Good | Good | Good |
| Pencil hardness | 6H | 6H | 7H | 6H | 7H | 5H |
| Anti-yellowing | Pass | Pass | Pass | Pass | Pass | Pass |
| Anti-thermal cracking | Pass | Pass | Fail | Fail | Fail | Fail |
| Gloss (60°) | 65 | 69 | 55 | 50 | 48 | 62 |

What is claimed is:

1. A photopolymer comprising: a monomer unit of Formula I, a monomer unit of Formula II, a monomer unit of Formula III, and a monomer unit of Formula IV:

I

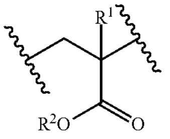

II

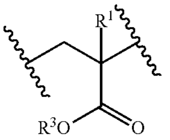

III

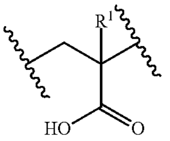

IV

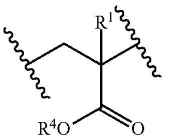

wherein each $R^1$ for each occurrence is independently hydrogen or methyl;

$R^2$ is $C_3$-$C_{12}$ cycloalkyl or $C_6$-$C_{12}$ polycyclyl;

$R^3$ is $C_1$-$C_{12}$ alkyl; and $R^4$ is selected from the group consisting of

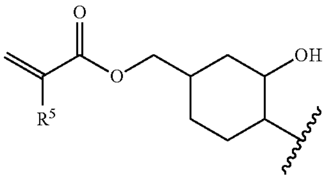

, and

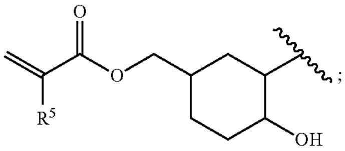

;

or $R^4$ is a mixture of

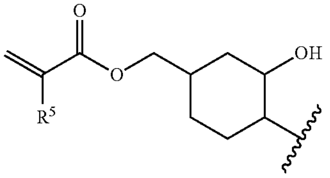

and

-continued

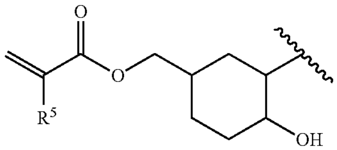

, wherein $R^5$ is hydrogen or methyl, wherein the photopolymer has a weight average molecular weight between 10,000 to 40,000 amu, and wherein the monomer unit of Formula I, the monomer unit of Formula II, the monomer unit of Formula III, and the monomer unit of Formula IV are present in the photopolymer between 1-15 mol %, 35-50 mol %, 15-25 mol %, and 30-55 mol %, respectively, relative to the total moles of the monomer unit of Formula I, the monomer unit of Formula II, the monomer unit of Formula III, and the monomer unit of Formula IV.

2. The photopolymer of claim 1, wherein $R^2$ is isobornyl, cyclohexyl, cyclopentyl, 3,3,5-trimethylcyclohexyl, tetrahydrofurfuryl, or 2-tetrahydropyranyl.

3. The photopolymer of claim 1, wherein $R^3$ is methyl, ethyl, propyl, isopropyl, butyl, isobutyl, tert-butyl, hexyl, octyl, decyl, or 2-ethylhexyl.

4. The photopolymer of claim 1, wherein $R^1$ is methyl; $R^2$ is isobornyl or cyclohexyl; $R^3$ is methyl, isobutyl, or n-hexyl; and $R^4$ is:

a mixture of

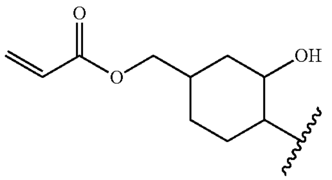

and

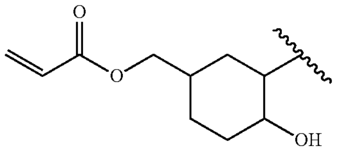

.

5. The photopolymer of claim 1, wherein the monomer unit of Formula I is present in the photopolymer between 1-10 mol % relative to the total moles of the monomer unit of Formula I, the monomer unit of Formula II, the monomer unit of Formula III, and the monomer unit of Formula IV.

6. The photopolymer of claim 1, wherein the monomer unit of Formula II is present in the photopolymer between 20-55 mol % relative to the total moles of the monomer unit of Formula I, the monomer unit of Formula II, the monomer unit of Formula III, and the monomer unit of Formula IV.

7. The photopolymer of claim 1, wherein the monomer unit of Formula III is present in the photopolymer between 10-30 mol % relative to the total moles of the monomer unit of Formula I, the monomer unit of Formula II, the monomer unit of Formula III, and the monomer unit of Formula IV.

8. The photopolymer of claim 1, wherein the monomer unit of Formula IV is present in the photopolymer between 35-48 mol % relative to the total moles of the monomer unit of Formula I, the monomer unit of Formula II, the monomer unit of Formula III, and the monomer unit of Formula IV.

9. The photopolymer of claim 1, wherein the monomer unit of Formula I, the monomer unit of Formula II, the monomer unit of Formula III, and the monomer unit of Formula IV are present in the photopolymer between 1-10 mol %, 35-50 mol %, 15-25 mol %, and 35-48 mol %, respectively, relative to the total moles of the monomer unit of Formula I, the monomer unit of Formula II, the monomer unit of Formula III, and the monomer unit of Formula IV.

10. The photopolymer of claim 4, wherein the monomer unit of Formula I, the monomer unit of Formula II, the monomer unit of Formula III, and the monomer unit of Formula IV are present in the photopolymer between 1-10 mol %, 35-50 mol %, 15-25 mol %, and 35-48 mol %, respectively, relative to the total moles of the monomer unit of Formula I, the monomer unit of Formula II, the monomer unit of Formula III, and the monomer unit of Formula IV.

11. The photopolymer of claim 1, wherein the photopolymer is selected from the group consisting of:

a photopolymer, wherein $R^1$ is methyl; $R^2$ is cyclohexyl; $R^3$ is isobutyl; and $R^4$ is a mixture of

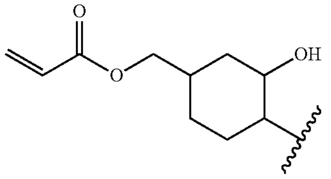

and

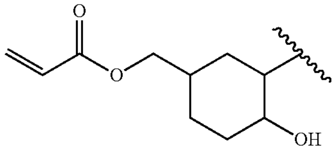

;

or a photopolymer, wherein $R^1$ is methyl; $R^2$ is isobornyl; $R^3$ is n-hexyl; and $R^4$ is a mixture of

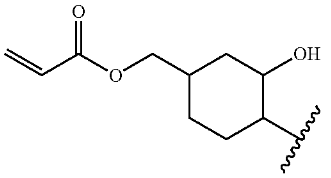

and

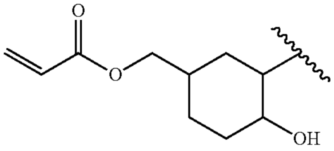

, wherein the monomer unit of Formula I, the monomer unit of Formula II, the monomer unit of Formula III, and the monomer unit of Formula IV are present in the photopolymer between 1-10 mol %, 35-50 mol %, 15-25 mol %, and 35-48 mol %, respectively, relative to the total moles of the monomer unit of Formula I, the monomer unit of Formula II, the monomer unit of Formula III, and the monomer unit of Formula IV.

12. The photopolymer of claim 11, wherein the photopolymer has a weight average molecular weight between 18,000 to 23,000 amu.

13. A solder mask ink comprising the photopolymer of claim 1 and an epoxy resin.

14. The solder mask ink of claim 13 further comprising a photoinitiator, a crosslinker, and a metal oxide.

15. A method of applying the solder mask ink of claim 14 to a substrate, the method comprising: applying the solder mask ink to a surface of the substrate and irradiating the solder mask ink with ultraviolet radiation.

* * * * *